(12) United States Patent
Wu et al.

(10) Patent No.: US 10,903,825 B1
(45) Date of Patent: Jan. 26, 2021

(54) PHASE CORRECTION CIRCUIT, PHASE CORRECTION METHOD AND ELECTRIC ENERGY METERING DEVICE

(71) Applicant: HANGZHOU VANGO TECHNOLOGIES, INC., Zhejiang (CN)

(72) Inventors: Boqiang Wu, Zhejiang (CN); Nick Nianxiong Tan, Zhejiang (CN); Changyou Men, Zhejiang (CN)

(73) Assignee: HANGZHOU VANGO TECHNOLOGIES, INC., Zhejiang (CN)

( * ) Notice: Subject to any disclaimer, the term of this patent is extended or adjusted under 35 U.S.C. 154(b) by 0 days.

(21) Appl. No.: 16/936,454

(22) Filed: Jul. 23, 2020

(30) Foreign Application Priority Data

May 13, 2020 (CN) .......................... 2020 1 0403566

(51) Int. Cl.
*H03K 5/01* (2006.01)
*G01R 22/06* (2006.01)
*H03K 3/037* (2006.01)
*H03K 5/00* (2006.01)

(52) U.S. Cl.
CPC ............. *H03K 5/01* (2013.01); *G01R 22/061* (2013.01); *H03K 3/037* (2013.01); *H03K 2005/00234* (2013.01)

(58) Field of Classification Search
CPC ........................................................ H03K 5/01
See application file for complete search history.

(56) References Cited

U.S. PATENT DOCUMENTS

| 7,466,166 | B2 * | 12/2008 | Date | G09G 3/3283 327/108 |
| 7,782,119 | B2 * | 8/2010 | Kameyama | G05F 3/227 327/513 |

\* cited by examiner

*Primary Examiner* — Hai L Nguyen
(74) *Attorney, Agent, or Firm* — Yue (Robert) Xu; Apex Attorneys at Law, LLP

(57) ABSTRACT

A phase correction circuit, a phase correction method and an electric energy metering device are provided. The phase correction circuit includes a reference voltage circuit and a current correction circuit. The reference voltage circuit includes a first predetermined number of first delay D flip-flops and a first synchronization D flip-flop. The current correction circuit includes a second predetermined number of second delay D flip-flops, a second synchronization D flip-flop and a data selector. The data selector outputs a current signal of one of the second delay D flip-flops to the second synchronization D flip-flop. The second predetermined number is greater than or equal to the first predetermined number. In a case that the second predetermined number is equal to the first predetermined number, each of the second predetermined number and the first predetermined number is greater than 1.

11 Claims, 6 Drawing Sheets

PHASE CORRECTION CIRCUIT, PHASE CORRECTION METHOD AND ELECTRIC ENERGY METERING DEVICE

CROSS-REFERENCE TO RELATED APPLICATIONS

This application claims priority to Chinese patent application No. 202010403566.4, titled "PHASE CORRECTION CIRCUIT, PHASE CORRECTION METHOD AND ELECTRIC ENERGY METERING DEVICE", filed May 13, 2020, with the China National Intellectual Property Administration, which is incorporated herein by reference in its entirety.

FIELD

The present disclosure relates to the technical field of electric energy metering, and in particular to a phase correction circuit, an electric energy metering device and a phase correction method.

BACKGROUND

In an electrical energy metering chip, since off-chip sensors are inconsistent, a phase difference between a voltage signal and a current signal may be caused. For the above case, conventional phase correction methods including the following first method and second method are provided. In the first method, as shown in FIG. 1, a D flip-flop (DFF) is additionally provided between an analog-to-digital converter (ADC) and a cascaded integrator-comb filter. With the first phase correction method, a correction range may be extended discretionarily. However, a phase correction precision is determined based on a sampling frequency of the ADC and a low sampling frequency of the ADC may cause a low phase correction accuracy. In the second method, as shown in FIG. 2, a DFF is additionally provided between an integrator (ITG) and a comb filter (COMB) in each cascaded integrator-comb filter. Specifically, as shown in FIG. 3, in each of a reference voltage circuit and a current correction circuit, two DFFs are additionally provided between an ITG and a COMB in each cascaded integrator-comb filter. One of the DFFs is used for delaying and the other is used for synchronizing. A phase correction precision of the second phase correction method is related to a clock frequency of a system. Since the clock frequency of the system is greater than the sampling frequency of the ADC, the second phase correction method can achieve a phase correction precision higher than that of the above first method. However, a phase correction range of the second phase correction method is related to a down-sampling rate of the cascaded integrator-comb filter, and in a case that the down-sampling rate of the cascaded integrator-comb filter is low, the phase correction range of the second phase correction method is narrow, which cannot satisfy the demand of a wide phase correction range.

Therefore, how to realize compatibility of a high phase correction precision and a wide phase correction range is a technical problem which is required to be solved by those skilled in the art.

SUMMARY

A phase correction circuit is provided according to the present disclosure to realize compatibility of a high phase correction precision and a wide phase correction range. An electric energy metering device and a phase correction method are further provided according to the present disclosure to realize the above technical effects.

In order to solve the above technical problems, a phase correction circuit is provided according to the present disclosure, which includes a reference voltage circuit and a current correction circuit.

The reference voltage circuit includes a first predetermined number of first delay D flip-flops and a first synchronization D flip-flop. The first delay D flip-flops are connected in series to form a first branch. An input terminal of a first delay D flip-flop at the beginning of the first branch receives a down-sampled voltage signal. An output terminal of a first delay D flip-flop at the end of the first branch is connected to an input terminal of the first synchronization D flip-flop to output the voltage signal to the first synchronization D flip-flop.

The current correction circuit includes a second predetermined number of second delay D flip-flops, a second synchronization D flip-flop and a data selector. The second delay D flip-flops are connected in series to form a second branch. An output terminal of each of the second delay D flip-flops is connected to an input terminal of the data selector. A second delay D flip-flop at the beginning of the second branch receives a down-sampled current signal. An output terminal of the data selector is connected to the second synchronization D flip-flop. The data selector is configured to select, in response to a selection control signal, in an exclusive manner a current signal outputted from one of the second delay D flip-flops and output the selected current signal to the second synchronization D flip-flop. The second predetermined number is greater than or equal to the first predetermined number. In a case that the second predetermined number is equal to the first predetermined number, each of the second predetermined number and the first predetermined number is greater than 1.

In an embodiment, the number of the second delay D flip-flops is greater than the number of the first delay D flip-flops.

In an embodiment, the number of the second delay D flip-flops is equal to the number of the first delay D flip-flops, and each of the number of the second delay D flip-flops and the number of the first delay D flip-flops is greater than 1.

In an embodiment, a data update condition of each of the first delay D flip-flops is that a clock signal is half of a down-sampling rate, and a data update condition of each of the first and second synchronization D flip-flops is that the clock signal is equal to the down-sampling rate.

In an embodiment, the number of the current correction circuit is two.

In order to solve the above technical problems, an electric energy metering device is further provided according to the present disclosure. The electric energy metering device is provided with the phase correction circuit described above.

In order to solve the above technical problems, a phase correction method applied to the phase correction circuit described above is further provided according to the present disclosure. The method includes:

generating a corresponding selection control signal and a corresponding correction control signal based on user settings, outputting the correction control signal to the delay D flip-flops in the current correction circuit, such that an output of each of the delay D flip-flops is equal to an input of the delay D flip-flop in a case that a count value of a system counter is equal to the correction control signal, and outputting the selection control signal to the data selector, for the data selector to select, in response to the selection control signal, in an exclusive manner a current signal outputted from one of the delay D flip-flops and output the selected current signal to the synchronization D flip-flop in the current correction circuit.

The phase correction circuit according to the present disclosure includes a reference voltage circuit and a current correction circuit. The reference voltage circuit includes a first predetermined number of first delay D flip-flops and a first synchronization D flip-flop. The first delay D flip-flops are connected in series to form a first branch. An input terminal of a first delay D flip-flop at the beginning of the first branch receives a down-sampled voltage signal. An output terminal of a first delay D flip-flop at the end of the first branch is connected to an input terminal of the first synchronization D flip-flop to output the voltage signal to the first synchronization D flip-flop. The current correction circuit includes a second predetermined number of second delay D flip-flops, a second synchronization D flip-flop and a data selector. The second delay D flip-flops are connected in series to form a second branch. An output terminal of each of the second delay D flip-flops is connected to an input terminal of the data selector. A second delay D flip-flop at the beginning of the second branch receives a down-sampled current signal. An output terminal of the data selector is connected to the second synchronization D flip-flop. The data selector is configured to select, in response to a selection control signal, in an exclusive manner a current signal outputted from one of the second delay D flip-flops and output the selected current signal to the second synchronization D flip-flop. The second predetermined number is greater than or equal to the first predetermined number. In a case that the second predetermined number is equal to the first predetermined number, each of the second predetermined number and the first predetermined number is greater than 1.

In view of the above, in the phase correction circuit according to the present disclosure, DFFs are provided between an ITG and a COMB in a cascaded integrator-comb filter, such that the phase correction precision is related to the clock frequency of the system. Since the clock frequency of the system is high, a high phase correction precision can be achieved. In addition, in the present disclosure, the number of the delay DFFs provided between the ITG and the COMB in the current correction circuit is greater than or equal to the number of delay DFFs provided between the ITG and the COMB in the reference voltage circuit. In a case that the number of the delay DFFs provided between the ITG and the COMB in the current correction circuit is equal to the number of delay DFFs provided between the ITG and the COMB in the reference voltage circuit, the number of the provided delay DFFs is at least two. Moreover, the data selector selects, in response to the selection control signal, in an exclusive manner a current signal outputted by one of the delay DFFs and outputs the selected current signal to the COMB. The phase correction range can be effectively extended by cascading multiple DFFs in the current correction circuit, thereby realizing the compatibility of the high phase correction precision and the wide phase correction range.

The electric energy metering device and the phase correction method according to the present disclosure can also realize the above technical effects.

BRIEF DESCRIPTION OF THE DRAWINGS

In order to more clearly describe the technical solutions in the embodiments of the present disclosure, drawings to be used in the description of the conventional technology and the embodiments are briefly described hereinafter. It is apparent that the drawings described below show merely some embodiments of the present disclosure, and those skilled in the art may obtain other drawings according to the provided drawings without any creative effort.

DETAILED DESCRIPTION OF EMBODIMENTS

A phase correction circuit is provided according to the present disclosure to realize compatibility of high phase correction precision and wide phase correction range. An electric energy metering device and a phase correction method are further provided according to the present disclosure to realize the above technical effects.

In order to make the objective, technical solutions and advantages of the present disclosure more clear, the technical solutions of the embodiments of the present disclosure are clearly and completely described below in conjunction with the drawings of the embodiments of the present disclosure. Apparently, the embodiments described in the following are only some embodiments of the present disclosure, rather than all the embodiments. Any other embodiments obtained by those skilled in the art based on the embodiments in the present disclosure without any creative effort fall within the protection scope of the present disclosure.

Figure 4:
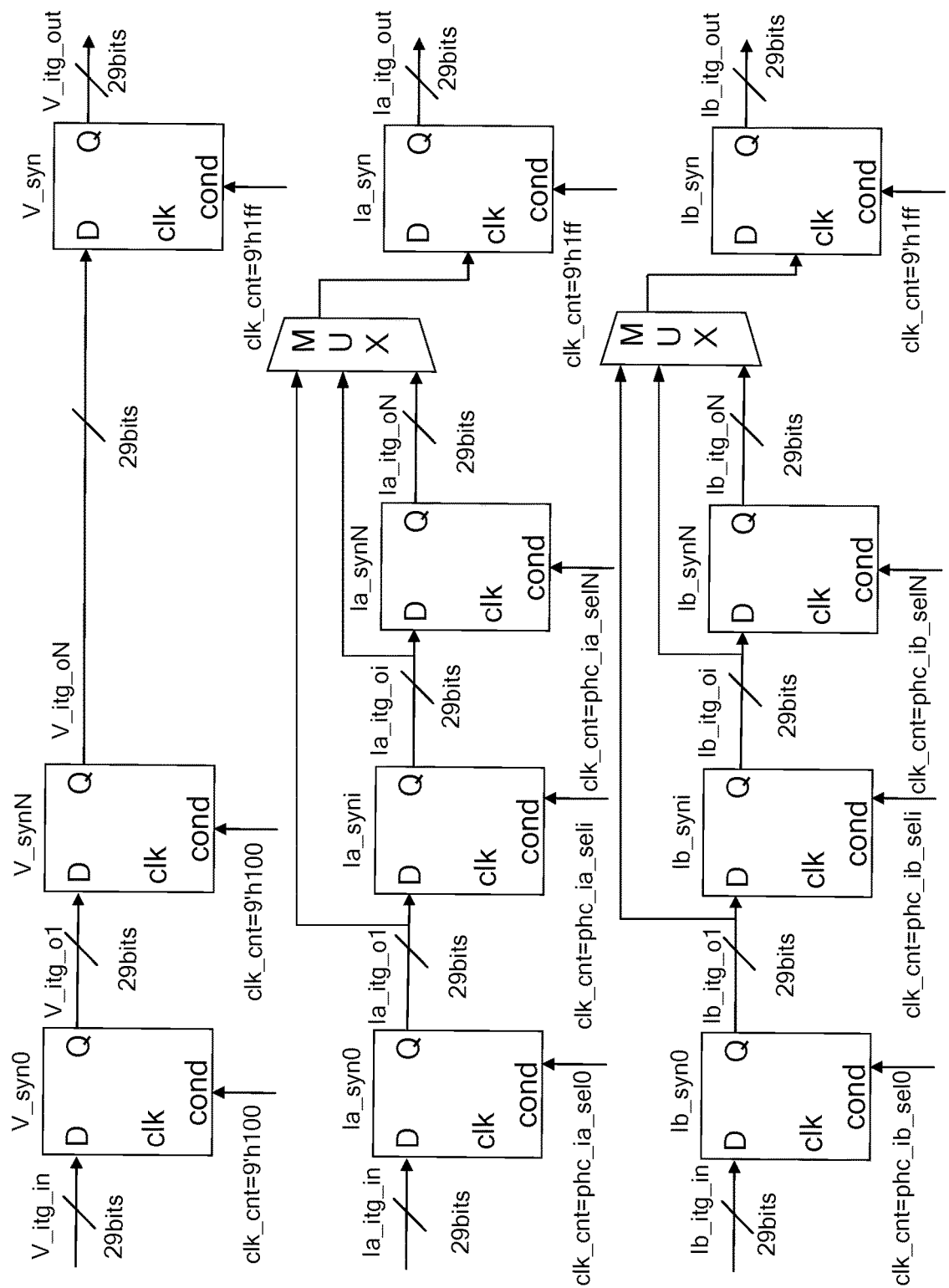
FIG. 4 is a schematic diagram of a phase correction circuit according to an embodiment of the present disclosure.

FIG. 4 is a schematic diagram of a phase correction circuit according to an embodiment of the present disclosure. As shown in FIG. 4, the phase correction circuit includes a reference voltage circuit and a current correction circuit.

The reference voltage circuit includes a first predetermined number of first delay DFFs and a first synchronization DFF. The first delay DFFs are connected in series to form a first branch. An input terminal of a first delay DFFs at the beginning of the first branch receives a down-sampled voltage signal. An output terminal of a first delay DFFs at the end of the first branch is connected to an input terminal of the first synchronization DFF to output the voltage signal to the first synchronization DFF. The current correction circuit includes a second predetermined number of second delay DFFs, a second synchronization DFF and a data selector. The second delay DFFs are connected in series to form a second branch. An output terminal of each of the second delay DFFs is connected to an input terminal of the data selector. A second delay DFF at the beginning of the second branch receives a down-sampled current signal. An output terminal of the data selector is connected to the second synchronization DFF. The data selector is configured to select, in response to a selection control signal, in an exclusive manner a current signal outputted from one of the second delay DFFs and output the selected current signal to the second synchronization DFF. The second predetermined number is greater than or equal to the first predetermined number. In a case that the second predetermined number is equal to the first predetermined number, each of the second predetermined number and the first predetermined number is greater than 1.

Specifically, the phase correction circuit according to the present disclosure corrects a phase of a current signal with reference to a voltage signal. The reference voltage circuit is provided with the first predetermined number of first delay DFFs. The first delay DFFs are connected in series to form a first branch, that is, an output terminal of a first delay DFF is connected to an input terminal of a subsequent first delay DFF. The input terminal of the first delay DFF at the beginning of the first branch is connected to an ITG of a cascaded integrator-comb filter to receive the down-sampled voltage signal. The output terminal of the first delay DFF at the end of the first branch is connected to the first synchronization DFF, such that the down-sampled voltage signal is outputted to the first synchronization DFF through the first delay DFFs. In addition, the output terminal of the first synchronization DFF is connected to a COMB of the cascaded integrator-comb filter to output the voltage signal to the COMB.

The delay DFF is used for delaying a signal. The synchronization DFF is used for synchronizing a signal. In a case that the first predetermined number is 1, that is, the number of the first delay DFFs is 1, the first delay DFF at the beginning of the first branch is in fact the first delay DFF at the end of the first branch.

In an embodiment, a data update condition of each of the first delay DFFs is that a count value of a system counter is half of a down-sampling rate of the cascaded integrator-comb filter. A data update condition of each of the first and second synchronization DFFs is that the count value of the system counter is equal to the down-sampling rate of the cascaded integrator-comb filter. For example, in a case that the down-sampling rate of the cascaded integrator-comb filter is 512 in the decimal system, the data update condition of each of the first delay DFFs is that the count value of the system counter is equal to 256 in the decimal system. The data update condition of each of the synchronization DFFs is that the count value of the system counter is equal to 512 in the decimal system.

The current correction circuit is provided with the second predetermined number of second delay DFFs. The second delay DFFs are connected in series to form the second branch, that is, an output terminal of a second delay DFF is connected to an input terminal of a subsequent second delay DFF. The input terminal of the second delay DFF at the beginning of the second branch is connected to an ITG of a cascaded integrator-comb filter to receive the down-sampled current signal. The output terminal of each of the second delay DFFs is connected to the data selector, such that the data selector selects a current signal that is to be outputted to the second synchronization DFF. The output terminal of the data selector is connected to the second synchronization DFF. The data selector is configured to, after receiving the selection control signal outputted from a controller, select, in response to a selection control signal, in an exclusive manner a current signal outputted from one of the second delay DFFs and output the selected current signal to the second synchronization DFF. An output terminal of the second synchronization DFF is connected to a COMB of the cascaded integrator-comb filter to output the current signal to the COMB of the cascaded integrator-comb filter. In an embodiment, the number of the current correction circuit is two, thereby simultaneously performing phase correction on two current signals.

It is important that the number of the second delay DFFs in the current correction circuit is greater than or equal to the number of the first delay DFFs in the reference voltage circuit. In a case that the number of the second delay DFFs in the current correction circuit is equal to the number of the first delay DFFs in the reference voltage circuit, each of the number of the first delay DFFs and the number of the second delay DFFs is greater than 1, that is, each of the number of the first delay DFFs and the number of the second delay DFFs is at least two. In this case, a phase lead adjustment range of a current signal can be extended. In a case that the number of the second delay DFFs in the current correction circuit is greater than the number of the first delay DFFs in the reference voltage circuit, the phase lead adjustment range and a phase lag adjustment range can both be extended. In addition, it can be understood that the greater the number of the cascaded delay DFFs is, the wider the phase adjustment range of the current signal is. A specific phase adjustment value of the current signal is determined based on the correction control signal outputted from the controller to each of the second delay DFFs and the selection control signal outputted to the data selector. Users may set a corresponding correction control signal and a corresponding selection control signal based on practical correction requirements.

In an embodiment, the number of the second delay DFFs is equal to the number of the first delay DFFs and each of the number of the second delay DFFs and the number of the first delay DFFs is greater than 1.

Figure 1:
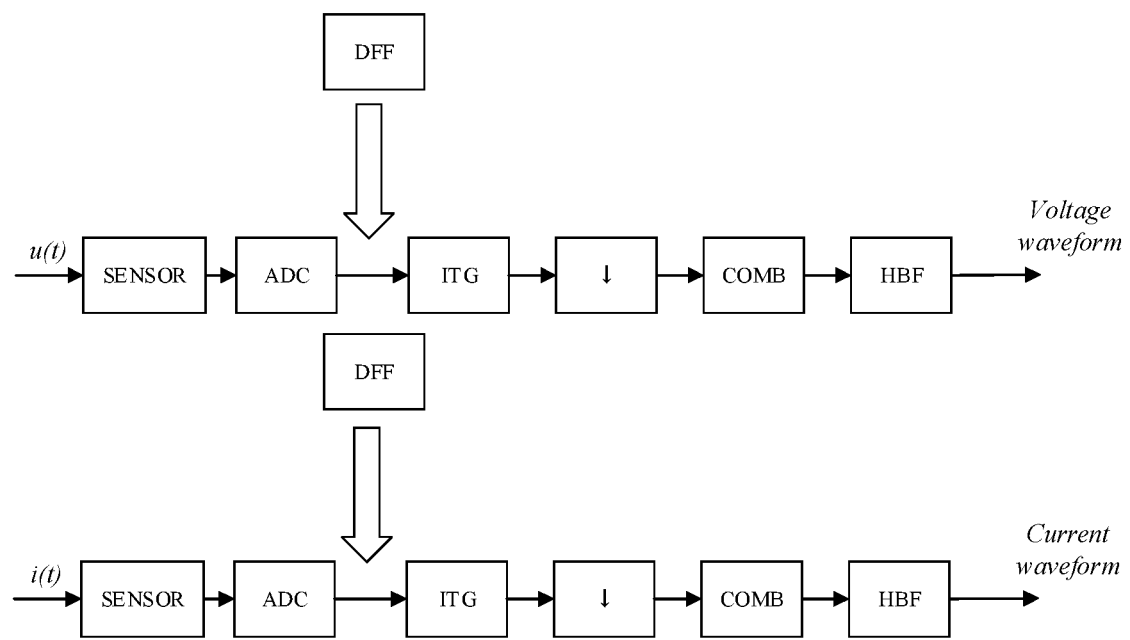
FIG. 1 is a schematic diagram of a conventional phase correction circuit.
Figure 2:
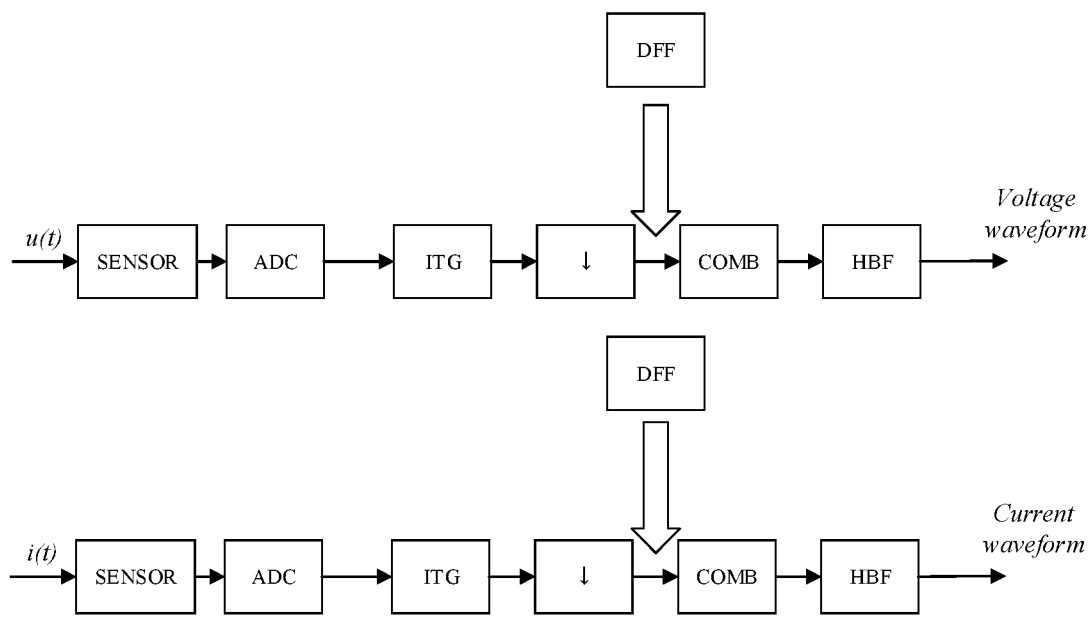
FIG. 2 is a schematic diagram of another conventional phase correction circuit.
Figure 3:
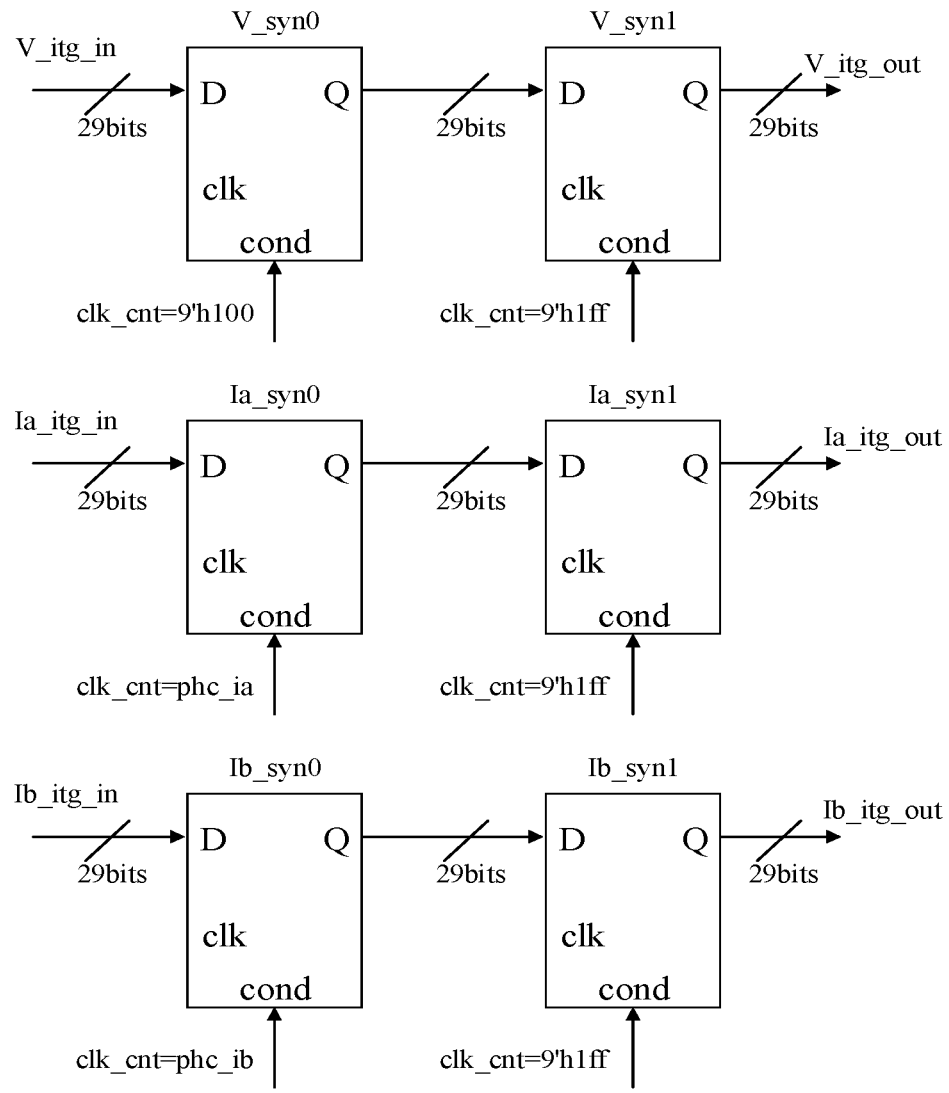
FIG. 3 is a schematic diagram of a circuit structure of the phase correction circuit shown in FIG. 2.
Figure 5:
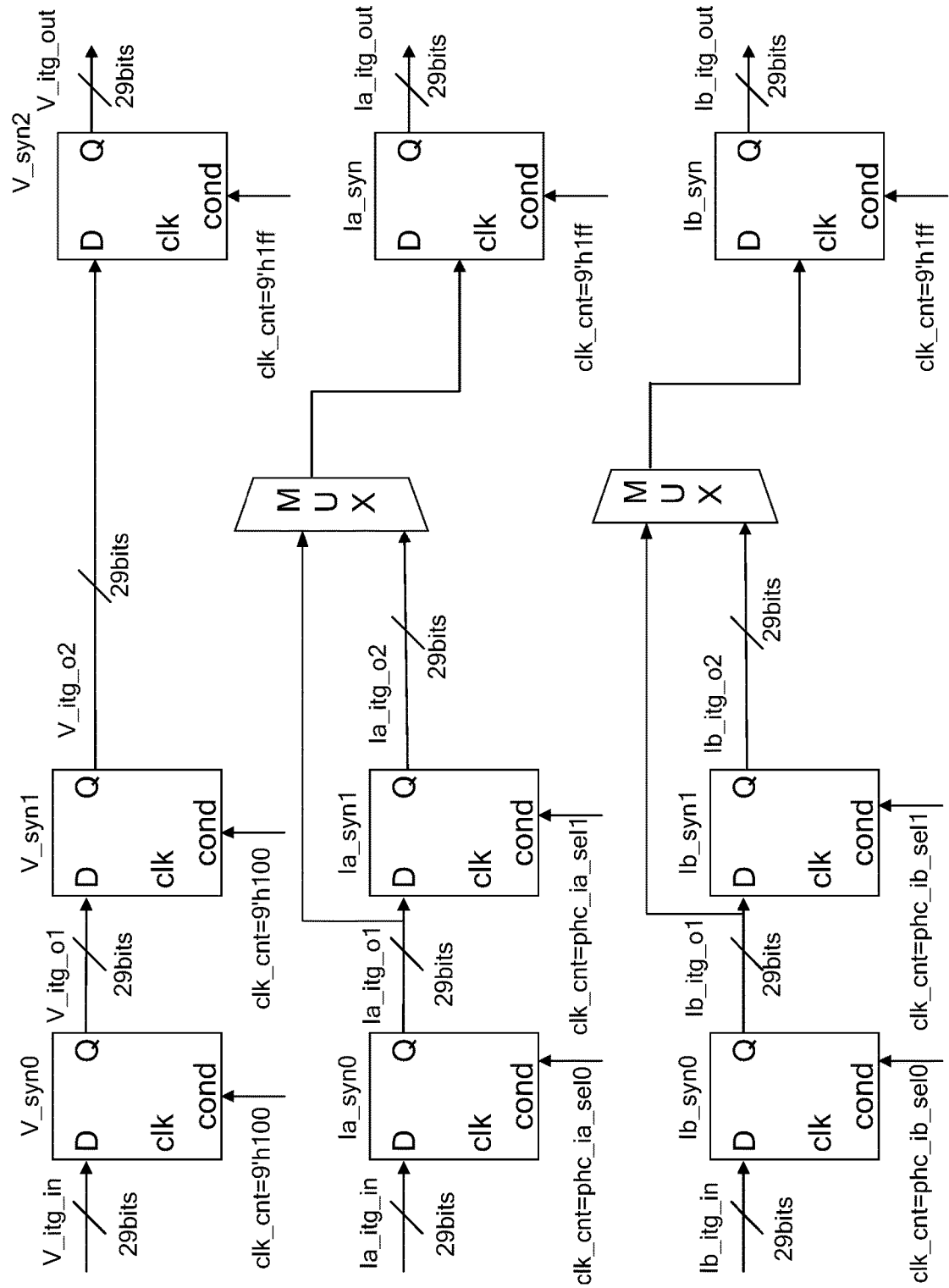
FIG. 5 is a schematic diagram of another phase correction circuit according to an embodiment of the present disclosure.

Specifically, as shown in FIG. 5, compared with the conventional phase correction circuit as shown in FIG. 3, in the embodiment, the number of first delay DFFs in a reference voltage circuit is equal to the number of second delay DFFs in a current correction circuit and the number is at least 2, thereby effectively extending a phase lead adjustment range of a current signal.

For example, an operating frequency of the cascaded integrator-comb filter is equal to one five hundred and twelfth (1/512) of a system clock frequency, that is, the down-sampling rate is 512, and the data update condition of each delay DFF in the reference voltage circuit is set as that a count value of a system clock counter (clk_cnt as shown in FIG. 3) is 9'h100, i.e., 256 in the decimal system. In this case, if a delay DFF in the current correction circuit updates data before the count value of the system clock counter reaches 256, a phase lead adjustment is performed on the current signal. If a delay DFF in the current correction circuit updates data after the count value of the system clock counter reaches 256, a phase lag adjustment is performed on the current signal. A specific phase adjustment value of the current signal is determined based on the correction control signals (phc_ia and phc_ib as shown in FIG. 3) and the phase correction accuracy.

For example, assuming that phc_ia is 300 in the decimal system, a phase lag adjustment is performed on a phase of a current signal Ia by phc_ia_cail=$(300-256) \times p_{c\_new}$ with reference to a voltage signal. In a case that the phase correction precision is 0.00549°, a phase lag adjustment is performed on the current signal Ia by 0.2417° with reference to the voltage signal. In a case that phc_ib is 200 in the decimal system, a phase lag adjustment is performed on the current signal Ia by phc_ib_cail=$(256-200) \times p_{c\_new}$ with reference to the voltage signal. In a case that the phase correction precision is 0.00549°, a phase lag adjustment is performed on the current signal Ib by 0.3076° with reference to the voltage signal. In this case, in the conventional phase correction method as shown in FIG. 3, a phase adjustment range of a current signal with reference to a voltage signal ranges from −256 to +256, which ranges from −1.40625° to +1.40076° in terms of angle, where −represents that a lead adjustment is performed and +represents that a lag adjustment is performed.

In the above equations, $p_{c\_new}$ represents the phase adjustment precision. Assuming that the system clock frequency is 3.2768 MHz, in this case, the phase adjustment precision is given by:

$$P_{c\_new} = \frac{360 \times 50}{3276800} = 0.00549°.$$

Compared with the conventional phase correction method shown in FIG. 3, phase correction effects of the embodiment are described by assuming that the number of the first delay DFFs and the number of the second delay DFFs are both two. A voltage signal is sampled through two first delay DFFs. Similarly, a data update condition of each of the two first delay DFFs is that clk_cnt=9'h100 (that is, 256 in the decimal system). In a case that the data selector selects a current signal Ia_itg_o1 outputted from a second delay DFF Ia_syn0 and outputs the current signal to a second synchronization DFF Ia_syn, a phase lead adjustment is performed on a current signal Ia_itg_in, and an adjustment value thereof is expressed by phc_coarse=pc_new*512+(phc_ia_sel0-256)*pc_new, where pc_new represents the phase adjustment precision, phc_ia_sel0 is a correction control signal of the second delay DFF Ia_syn0. The correction control signal is determined based on preactical phase correction requirements. In this case, a phase adjustment interval is from −768 to 255, which is extended three times that of the conventional phase correction method as shown in FIG. 3. In a case that the data selector selects a current signal Ia_itg_o2 outputted from a second delay DFF Ia_syn1 and outputs the current signal to the second synchronization DFF Ia_syn, the phase adjustment interval is from −256 to 255, and a specific adjustment value thereof is determined based on phc_ia_sel1.

In an embodiment, the number of the second delay DFFs is greater than the number of the first delay DFFs.

Figure 6:
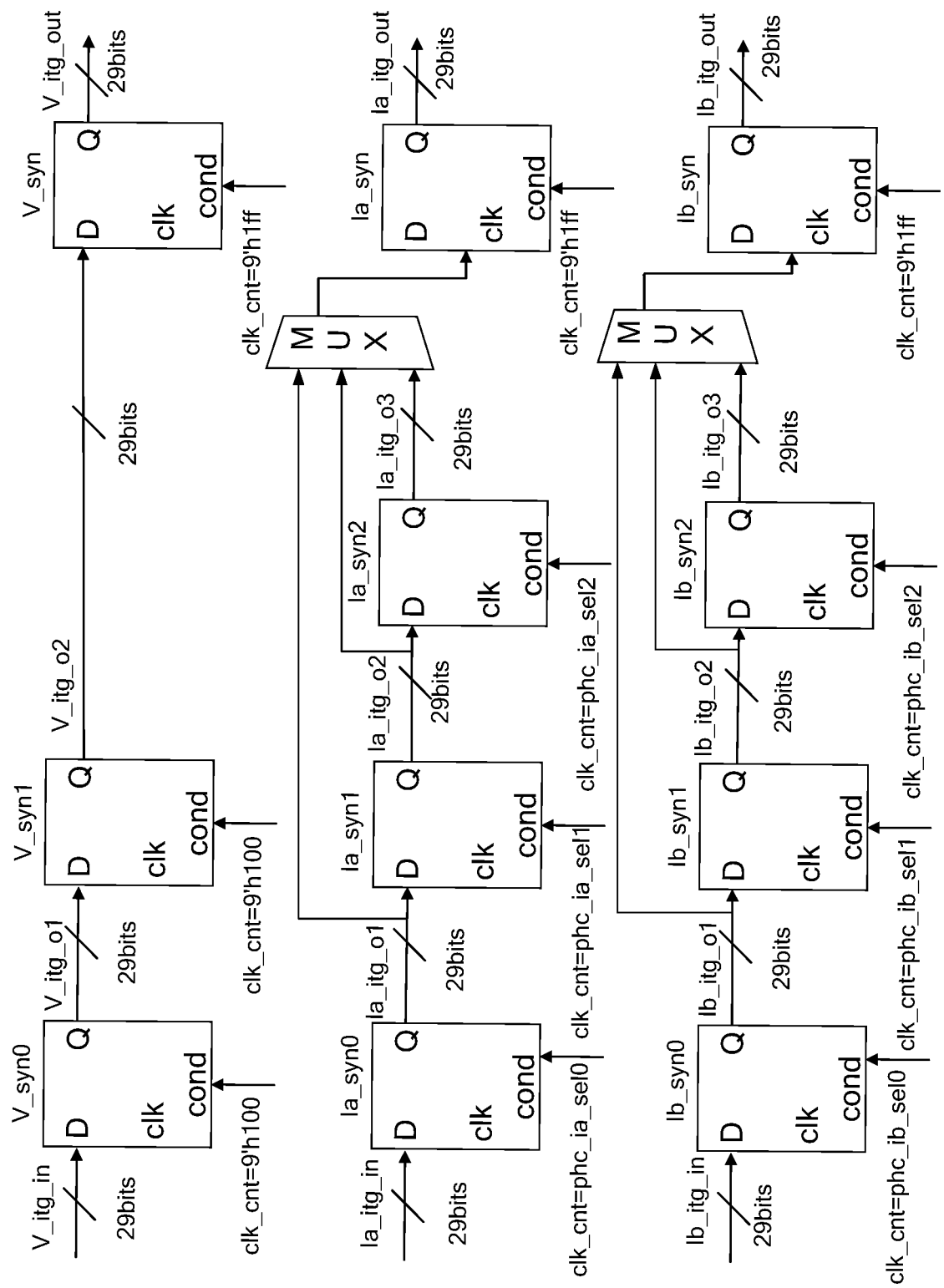
FIG. 6 is a schematic diagram of another phase correction circuit according to an embodiment of the present disclosure.

Specifically, as shown in FIG. 6, different from the conventional phase correction circuit as shown in FIG. 3, in this embodiment, the number of the second delay DFFs in the current correction circuit is greater than the number of the first delay DFFs in the reference voltage circuit, thereby effectively extending not only the phase lead adjustment range but also the phase lag adjustment range of a current signal.

The phase correction effects of the embodiment compared with the conventional phase correction method shown in FIG. 3 are described by assuming that the number of the first delay DFFs is two and the number of the second delay DFFs is three. A voltage signal is sampled through the two first delay DFFs. A data update condition of each of the two first delay DFFs is that clk_cnt=9'h100 (that is, 256 in the decimal system). In a case that the data selector selects a current signal Ia_itg_o1 outputted from a second delay DFF Ia_syn0 and outputs the current signal to a second synchronization DFF Ia_syn, a phase lead adjustment is performed on the current signal, and an adjustment value thereof is expressed by phc_coarse=$p_{c\_new}$*512+(phc_ia_sel0-256)*$p_{c\_new}$, where phc_ia_sel0 is a correction control signal of the first delay DFF Ia_syn0. The correction control signal is determined based on a practical phase correction range.

In a case that the data selector selects a current signal Ia_itg_o2 outputted from the second delay DFF Ia_syn1 and outputs the current signal to the second synchronization DFF Ia_syn, the phase adjustment interval is from −256 to 255, which is the same as that of the conventional phase correction method shown in FIG. 3. A specific adjustment value thereof is determined based on phc_ia_sel1.

In a case that the data selector selects a current signal Ia_itg_o3 outputted from the second delay DFF Ia_syn2 and outputs the current signal to the second synchronization DFF, that is, the current signal is outputted to the second synchronization DFF Ia_syn through three second delay DFFs Ia_syn0, Ia_syn1 and Ia_syn2. In a case that a data update condition of each of the second delay DFF Ia_syn0 and the second delay DFF Ia_syn1 is clk=9'h100, a phase lag adjustment is performed on the current signal and an adjustment value thereof is expressed by:

phc_coarse_delay=$p_{c\_new}$*512+(phc_ia_sel2-256)
*$p_{c\_new}$

Therefore, compared with the conventional phase correction method as shown in FIG. 3, with the phase correction circuit according to the embodiment, a phase lead adjustment range and a phase lag adjustment range are both tripled.

In view of the above, in the phase correction circuit according to the present disclosure, DFFs are provided between an ITG and a COMB in a cascaded integrator-comb filter, such that the phase correction precision is related to the clock frequency of the system. Since the clock frequency of the system is high, a high phase correction precision can be achieved. In addition, in the present disclosure, the number of the delay DFFs provided between the ITG and the COMB in the current correction circuit is greater than or equal to the number of delay DFFs provided between the ITG and the COMB in the reference voltage circuit. In a case that the number of the delay DFFs provided between the ITG and the COMB in the current correction circuit is equal to the number of delay DFFs provided between the ITG and the COMB in the reference voltage circuit, the number of the provided delay DFFs is at least two. Moreover, the data selector selects, in response to a selection control signal, in an exclusive manner a current signal outputted by one of the delay DFFs and outputs the selected current signal to the COMB. The phase correction range can be effectively extended by cascading multiple DFFs in the current correction circuit, thereby realizing the compatibility of the high phase correction precision and the wide phase correction range.

An electric energy metering device is further provided according to the present disclosure. The electric energy metering device is provided with the phase correction circuit as described in the above embodiments. Reference can be made to the above embodiments of the phase correction circuit for descriptions of the electric energy metering device according to the present disclosure, which are not repeated herein.

A phase correction method applied to the phase correction circuit described in the above embodiments is further provided according to the present disclosure. The method includes:

generating a corresponding selection control signal and a corresponding correction control signal based on user settings, outputting the correction control signal to the delay D flip-flops in the current correction circuit, such that an output of each of the delay D flip-flops is equal to an input of the delay D flip-flop in a case that a count value of a system counter is equal to the correction control signal, and outputting the selection control signal to the data selector, for the data selector to select, in response to the selection control signal, in an exclusive manner a current signal outputted from one of the delay D flip-flops and output the selected current signal to the synchronization D flip-flop in the current correction circuit.

Reference can be made to the above embodiments of the phase correction circuit for descriptions of the phase correction method according to the present disclosure, which are not repeated herein.

Because of the complexity of the cases, it is impossible to enumerate all examples. Those skilled in the art should appreciate that multiple examples may be obtained in combination with practical situations and based on basic principles of the embodiments provided in the present disclosure. Examples obtained without any creative effort fall within the scope of the present disclosure.

The embodiments in this specification are described in a progressive way, each of which emphasizes the differences from others, and the same or similar parts among the embodiments can be referred to each other.

The phase correction circuit, the phase correction method and the electric energy metering device provided in the present disclosure are described in detail above. Specific examples are used herein to illustrate the principle and the implementation of the present disclosure. The above embodiments are only used to help understand the method and core concept of the present disclosure. It is to be noted that those skilled in the art can make various improvements and refinements to the present disclosure without departing from the principle of the present disclosure. The improvements and refinements shall also fall within the protection scope of the claims of the present disclosure.

It is further noted that in the present disclosure, relational terms such as "first" and "second" are merely used to distinguish one entity or operation from another entity or operation, but do not indicate or imply an actual relationship or order of these entities or operations. Moreover, the terms "include", "comprise" or any other variants are intended to be non-exclusive. Therefore, a process, method, article or device including multiple elements includes not only the elements but also other elements that are not enumerated, or also include the elements inherent for the process, method, article or device. Unless expressively limited otherwise, the statement "comprising (including) one . . . " does not exclude the case that other similar elements may exist in the process, method, article or device.

The invention claimed is:

1. A phase correction circuit, comprising a reference voltage circuit and a current correction circuit, wherein
the reference voltage circuit comprises a first predetermined number of first delay D flip-flops and a first synchronization D flip-flop, wherein the first delay D flip-flops are connected in series to form a first branch, an input terminal of a first delay D flip-flop at the beginning of the first branch receives a down-sampled voltage signal, and an output terminal of a first delay D flip-flop at the end of the first branch is connected to an input terminal of the first synchronization D flip-flop to output the voltage signal to the first synchronization D flip-flop;

the current correction circuit comprises a second predetermined number of second delay D flip-flops, a second synchronization D flip-flop and a data selector, wherein the second delay D flip-flops are connected in series to form a second branch, an output terminal of each of the second delay D flip-flops is connected to an input terminal of the data selector, a second delay D flip-flop at the beginning of the second branch receives a down-sampled current signal, an output terminal of the data selector is connected to the second synchronization D flip-flop, and the data selector is configured to select, in response to a selection control signal, in an exclusive manner a current signal outputted from one of the second delay D flip-flops and output the selected current signal to the second synchronization D flip-flop; and the second predetermined number is greater than or equal to the first predetermined number, and in a case that the second predetermined number is equal to the first predetermined number, each of the second predetermined number and the first predetermined number is greater than 1.

2. The phase correction circuit according to claim 1, wherein the number of the second delay D flip-flops is greater than the number of the first delay D flip-flops.

3. The phase correction circuit according to claim 1, wherein the number of the second delay D flip-flops is equal to the number of the first delay D flip-flops, and each of the number of the second delay D flip-flops and the number of the first delay D flip-flops is greater than 1.

4. The phase correction circuit according to claim 3, wherein a data update condition of each of the first delay D flip-flops is that a clock signal is half of a down-sampling rate, and a data update condition of each of the first and second synchronization D flip-flops is that the clock signal is equal to the down-sampling rate.

5. The phase correction circuit according to claim 4, wherein the number of the current correction circuit is two.

6. A phase correction method applied to the phase correction circuit according to claim 1, wherein the method comprises:
generating a corresponding selection control signal and a corresponding correction control signal based on user settings;
outputting the correction control signal to the delay D flip-flops in the current correction circuits, wherein an output of each of the delay D flip-flops is equal to an input of the delay D flip-flop in a case that a count value of a system counter is equal to the correction control signal;
outputting the selection control signal to the data selector, for the data selector to select, in response to the selection control signal, in an exclusive manner a current signal outputted from one of the delay D flip-flops and output the selected current signal to the synchronization D flip-flop in the current correction circuit.

7. An electric energy metering device, comprising a phase correction circuit,
wherein the phase correction circuit comprises a reference voltage circuit and a current correction circuit, wherein
the reference voltage circuit comprises a first predetermined number of first delay D flip-flops and a first synchronization D flip-flop, wherein the first delay D flip-flops are connected in series to form a first branch, an input terminal of a first delay D flip-flop at the beginning of the first branch receives a down-sampled voltage signal, and an output terminal of a first delay D flip-flop at the end of the first branch is connected to an input terminal of the first synchronization D flip-flop to output the voltage signal to the first synchronization D flip-flop;

the current correction circuit comprises a second predetermined number of second delay D flip-flops, a second synchronization D flip-flop and a data selector, wherein the second delay D flip-flops are connected in series to form a second branch, an output terminal of each of the second delay D flip-flops is connected to an input terminal of the data selector, a second delay D flip-flop at the beginning of the second branch receives a down-sampled current signal, an output terminal of the data selector is connected to the second synchronization D flip-flop, and the data selector is configured to select, in response to a selection control signal, in an exclusive manner a current signal outputted from one of the second delay D flip-flops and output the selected current signal to the second synchronization D flip-flop; and the second predetermined number is greater than or equal to the first predetermined number, and in a case that the second predetermined number is equal to the first predetermined number, each of the second predetermined number and the first predetermined number is greater than 1.

8. The device according to claim 7, wherein the number of the second delay D flip-flops is greater than the number of the first delay D flip-flops.

9. The device according to claim 7, wherein the number of the second delay D flip-flops is equal to the number of the first delay D flip-flops, and each of the number of the second delay D flip-flops and the number of the first delay D flip-flops is greater than 1.

10. The device according to claim 9, wherein a data update condition of each of the first delay D flip-flops is that a clock signal is half of a down-sampling rate, and a data update condition of each of the first and second synchronization D flip-flops is that the clock signal is equal to the down-sampling rate.

11. The device according to claim 10, wherein the number of the current correction circuit is two.

* * * * *